United States Patent
Li

(10) Patent No.: US 9,455,712 B2
(45) Date of Patent: Sep. 27, 2016

(54) FAST VOLTAGE DOMAIN CONVERTERS WITH SYMMETRIC AND SUPPLY INSENSITIVE PROPAGATION DELAY

(71) Applicant: QUALCOMM Incorporated, San Diego, CA (US)

(72) Inventor: Shengyuan Li, Woodland Hills, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/449,393

(22) Filed: Aug. 1, 2014

(65) Prior Publication Data

US 2016/0036444 A1    Feb. 4, 2016

(51) Int. Cl.
| | |
|---|---|
| H03L 5/00 | (2006.01) |
| H03K 19/0175 | (2006.01) |
| H03K 19/00 | (2006.01) |
| H03K 3/356 | (2006.01) |
| H03K 19/0185 | (2006.01) |

(52) U.S. Cl.
CPC ...... *H03K 19/017545* (2013.01); *H03K 3/356104* (2013.01); *H03K 19/0005* (2013.01); *H03K 19/018528* (2013.01)

(58) Field of Classification Search
CPC .............................................. H03K 19/018521
USPC .................. 327/306, 333; 326/61–62, 80–81
See application file for complete search history.

(56) References Cited

U.S. PATENT DOCUMENTS

| | | | | |
|---|---|---|---|---|
| 5,172,078 A | * | 12/1992 | Mijuskovic | ............... 331/108 R |
| 5,453,704 A | | 9/1995 | Kawashima | |
| 5,864,246 A | * | 1/1999 | Anderson | ........... H03K 5/00006 327/116 |
| 6,204,651 B1 | * | 3/2001 | Marcus et al. | ................ 323/283 |
| 6,756,839 B2 | | 6/2004 | Hall et al. | |
| 7,026,855 B2 | * | 4/2006 | Sueoka | .................. H03K 5/153 326/68 |

(Continued)

FOREIGN PATENT DOCUMENTS

| | | |
|---|---|---|
| EP | 2763320 A1 | 8/2014 |
| WO | 2013046898 A1 | 4/2013 |

OTHER PUBLICATIONS

Beal R., et al., "A Low Voltage Rail-to-Rail Operational Amplifier with Constant Operation and Improved Process Robustness," 2009, 103 pages.

(Continued)

*Primary Examiner* — Dinh T Le
(74) *Attorney, Agent, or Firm* — Haynes and Boone, LLP

(57) ABSTRACT

In one embodiment, a circuit comprises a phase interpolator that converts a single-ended input to a pair of symmetric differential signals within a first voltage domain. The circuit further comprises a comparator that converts the symmetric differential signals into single-ended output in a second different voltage domain. In one embodiment, the single ended output of the comparator is configured to be coupled to drive a switching driver in a switching regulator. In one embodiment, the interpolator comprises a first inverter, a second inverter, and a third inverter connected in series. The interpolator further comprises a first resistor and a second resistor connected in series. The second inverter provides a first output signal. Outputs of the first inverter and the third inverter are connected by the series connected resistors. A node between the resistors provides a second output signal. The first and second output signals are inverted and symmetric.

16 Claims, 6 Drawing Sheets

(56) References Cited

U.S. PATENT DOCUMENTS

| | | |
|---|---|---|
| 7,212,033 B2 | 5/2007 | Subramanian |
| 7,843,247 B1 | 11/2010 | Bazes |
| 7,884,646 B1 * | 2/2011 | Bourstein ............... 326/81 |
| 8,384,438 B1 | 2/2013 | Du et al. |
| 2011/0115542 A1 | 5/2011 | Koike |
| 2013/0285706 A1 * | 10/2013 | Doi ............... 327/94 |
| 2014/0197872 A1 | 7/2014 | Alessandro |

OTHER PUBLICATIONS

International Search Report and Written Opinion—PCT/US2015/040984—ISA/EPO—Oct. 6, 2015.

\* cited by examiner

FAST VOLTAGE DOMAIN CONVERTERS WITH SYMMETRIC AND SUPPLY INSENSITIVE PROPAGATION DELAY

BACKGROUND

The disclosure relates to voltage domain converters, and in particular, to fast voltage domain converters with symmetric and supply insensitive propagation delay.

Unless otherwise indicated herein, the approaches described in this section are not admitted to be prior art by inclusion in this section.

A switching driver having a cascode power stage can be used to control a switching regulator. In the cascode power stage, a single-ended input signal from one voltage domain such as voltages DVDD/DVSS is split into high-side and low-side paths to drive high side (HS) and low side (LS) power field effect transistors (FETS), respectively, of the switching driver. The HS power FETS operate in a second voltage domain such as voltages VDD/VMHS (mid-voltage high side), while the LS power FETS operate in a third voltage domain such as voltages VMLS (mid-voltage high side)/GND. Even when the difference between the voltages VDD and VMHS equals the difference between the voltages VMLS and GND, each individual voltage is different. The second voltage domain and the third voltage domain are disturbed independently and differently all the time due to switching activities. Conventional level shifters consume large amounts of power and generate unbalanced and unsymmetrical propagation delay, thereby reducing the efficiency of the switching regulator.

SUMMARY

The present disclosure describes fast voltage domain converters with symmetric and supply insensitive propagation delay.

In one embodiment, the present disclosure provides a level shifter comprising a phase interpolator that converts a single-ended input to a pair of symmetric differential signals within a first voltage domain. The level shifter further comprises a comparator that converts the symmetric differential signals into a single-ended output in a second different voltage domain.

In one embodiment, the single ended output of the comparator is configured to be coupled to drive a switching driver in a switching regulator.

In one embodiment, the interpolator comprises a first inverter, a second inverter, and a third inverter connected in series. The interpolator further comprises a first resistor and a second resistor connected in series. The second inverter provides a first output signal. Outputs of the first inverter and the third inverter are connected by the series connected first resistor and second resistor. A node between the first resistor and the second resistor provides a second output signal. The first and second output signals are inverted and symmetric.

In one embodiment, the interpolator comprises a first inverter, a second inverter, and a third inverter connected in series. The interpolator further comprises a voltage divider coupled between outputs of the first inverter and the third inverter. The divider provides a first one of the pair of symmetric differential signals. The first inverter provides a second one of the pair of symmetric differential signals.

In one embodiment, the interpolator drives the comparator. The comparator includes a differential input pair that generates a pair of currents in response to the outputs of the interpolator, and a summing circuit that adds the pair of currents from the comparator and generates a voltage signal indicative of the added pair of currents to an inverter operating in the second voltage domain.

In one embodiment, the comparator includes an inverter that inverts the voltage signal generated by the summing circuit to generate the single-ended output in the second different voltage domain.

In one embodiment, the disclosure provides a method that comprises converting a single-ended input to a pair of symmetric differential signals within a first voltage domain; and converting the symmetric differential signals into single-ended output in a second different voltage domain.

In one embodiment, the method further comprises applying the single-ended output in the second different voltage domain to a switching driver for controlling a switching regulator.

In one embodiment, converting a single-ended input to a pair of symmetric differential signals within a first voltage domain comprises: inverting the single-ended input to generate a first inverted signal; generating a second inverted signal as a first one of the symmetric differential signal in response to an inversion of the first inverted signal and a feedback signal; generating a third inverted signal in response to an inversion of the second inverted signal; generating the feedback signal from the third inverted signal; and generating a second one of the symmetric differential signal from the feedback signal.

In one embodiment, generating a second one of the symmetric differential signal from the feedback signal comprises dividing the first inverted signal and the second inverted signal.

In one embodiment, converting a single-ended input to a pair of symmetric differential signals within a first voltage domain comprises generating a first inverted signal, a second inverted signal, and a third inverted signal in series from a single ended input signal; coupling the first inverted signal and the third inverted signal; and dividing the coupled first inverted signal and the third inverted signal to provide a first one of the pair of symmetric differential signals, the first inverter providing a second one of the pair of symmetric differential signals.

In one embodiment, converting the symmetric differential signals into single-ended output in a second different voltage domain comprises: generating a differential input pair of currents in response to the pair of symmetric differential signals within a first voltage domain, and summing the pair of currents to generate the single-ended output indicative of the summed current.

In one embodiment, converting the symmetric differential signals into single-ended output in a second different voltage domain comprises: generating a differential input pair of currents in response to the pair of symmetric differential signals within a first voltage domain, summing the pair of currents to generate a voltage signal; and inverting the voltage signal generated by the summing circuit to generate the single-ended output in the second different voltage domain.

In one embodiment, the disclosure provides a level shifter circuit comprising: means for converting a single-ended input to a pair of symmetric differential signals within a first voltage domain; and means for converting the symmetric differential signals into single-ended output in a second different voltage domain.

In one embodiment, the level shifter circuit further comprises means for applying the single-ended output in the second different voltage domain to a switching driver for controlling a switching regulator.

In one embodiment, the means for converting a single-ended input to a pair of symmetric differential signals within a first voltage domain comprises: means for inverting the single-ended input to generate a first inverted signal; means for generating a second inverted signal as a first one of the symmetric differential signal in response to an inversion of the first inverted signal and a feedback signal; means for generating a third inverted signal in response to an inversion of the second inverted signal; means for generating the feedback signal from the third inverted signal; and means for generating a second one of the symmetric differential signal from the feedback signal.

In one embodiment, the means for generating a second one of the symmetric differential signal from the feedback signal comprises means for dividing the first inverted signal and the second inverted signal.

In one embodiment, the means for converting a single-ended input to a pair of symmetric differential signals within a first voltage domain comprises: means for generating a first inverted signal, a second inverted signal, and a third inverted signal in series from a single ended input signal; means for coupling the first inverted signal and the third inverted signal; and means for dividing the coupled first inverted signal and the third inverted signal to provide a first one of the pair of symmetric differential signals, the first inverted signal providing a second one of the pair of symmetric differential signals.

In one embodiment, the means for converting the symmetric differential signals into single-ended output in a second different voltage domain comprises: means for generating a differential input pair of currents in response to the pair of symmetric differential signals within a first voltage domain; and means for summing the pair of currents to generate the single-ended output indicative of the summed current.

In one embodiment, the means for converting the symmetric differential signals into single-ended output in a second different voltage domain comprises: means for generating a differential input pair of currents in response to the pair of symmetric differential signals within a first voltage domain; means for summing the pair of currents to generate a voltage signal; and means for inverting the voltage signal generated by the summing circuit to generate the single-ended output in the second different voltage domain.

The following detailed description and accompanying drawings provide a better understanding of the nature and advantages of the present disclosure.

BRIEF DESCRIPTION OF THE DRAWINGS

With respect to the discussion to follow and in particular to the drawings, it is stressed that the particulars shown represent examples for purposes of illustrative discussion, and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, make apparent to those of skill in the art how embodiments in accordance with the present disclosure may be practiced. In the accompanying drawings.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

Figure 1:
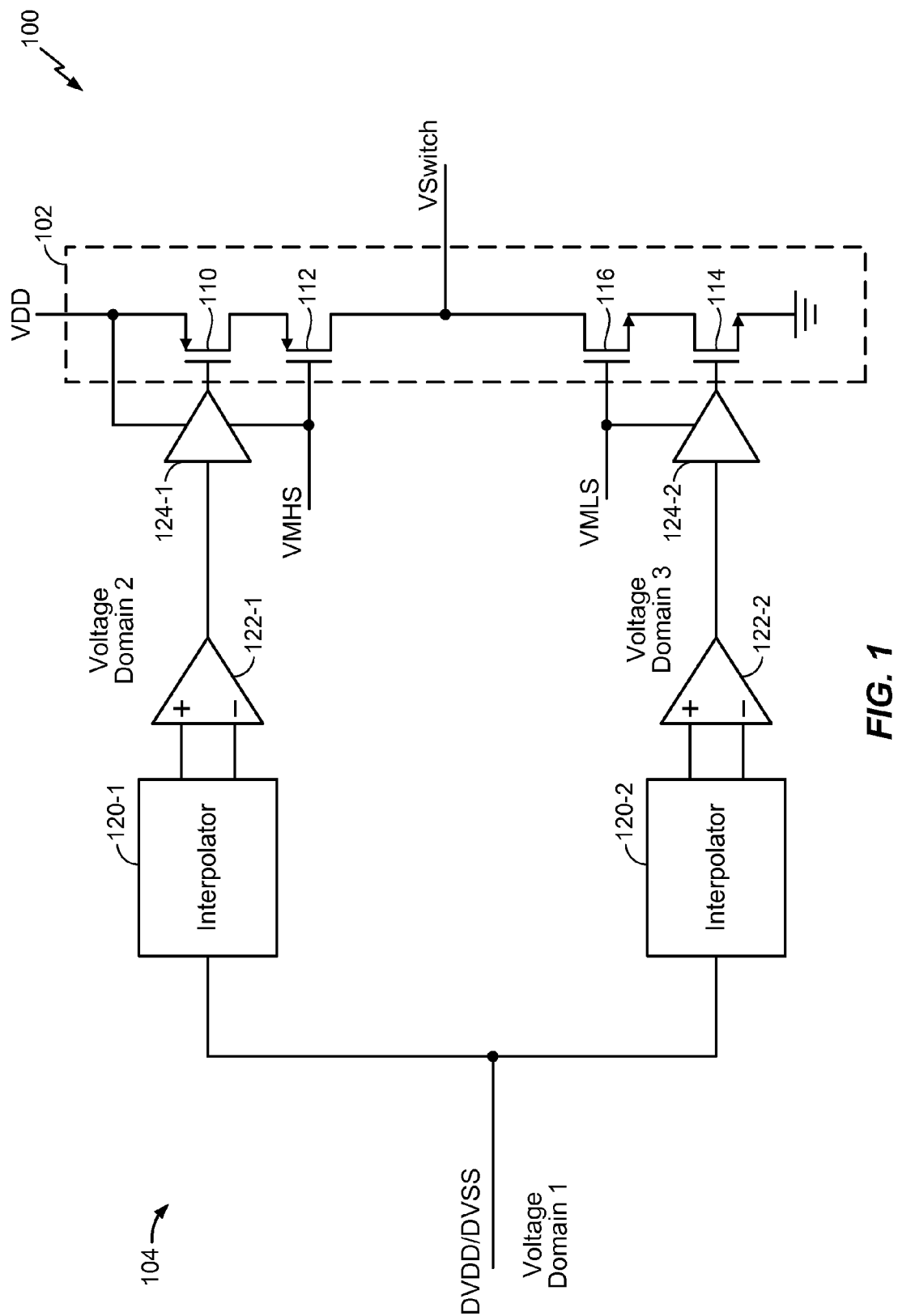
FIG. 1 illustrates a block diagram of a switching driver according to an embodiment.

FIG. 1 illustrates a block diagram of a switching driver 100 according to an embodiment. Switching driver 100 comprises a field effect transistor (FET) switching driver 102 and a voltage level shifter 104. In some embodiments, voltage level shifter 104 is a fast voltage domain converter with symmetric and supply insensitive propagation delay.

FET switching driver 102 can be used for driving a switching regulator, such as a buck convertor. FET switching driver 102 comprises a high side that includes a high side switching power transistor 110 and a high side cascode transistor 112, and comprises a low side that includes a low side switching power transistor 114 and a low side cascode transistor 116. Cascode transistors 112 and 116 are high side and low side cascode transistors, respectively, to reduce voltage drop across switching power transistors 110 and 114, respectively.

Voltage level shifter 104 comprises a plurality of phase interpolators 120-1 and 120-2, a plurality of comparators 122-1 and 122-2, and a plurality of switching drivers 124-1 and 124-2. The high side switching power transistor 110 is driven by switching driver 124-1 that has voltage rails of VDD (e.g., 3.7 V) and a high side voltage VMHS (e.g., 1.2 V). The high side cascode transistor 112 is biased by the high side voltage VMHS. The low side switching power transistor 114 is driven by switching driver 124-2 that has voltage rails of low side voltage VMLS (e.g., 2.5 V) and a ground. The low side cascode transistor 116 is biased by the low side voltage VMLS. Switching drivers 124-1 and 124-2 provide switching signals to the gates of the switching power transistors 110 and 116, respectively, in response to a control signal from comparators 122-1 and 122-2, respectively.

Phase interpolator 120 first converts a single-ended input in a first voltage domain 1 (voltages DVDD/DVSS) (e.g., 1.2 Volts/0.0 Volts) to a pair of symmetric differential signals within the same voltage domain 1 that are provided to comparator 122. Comparator 122 can be a current based symmetric comparator and can convert the symmetric differential signals into a single-ended output in a different voltage domain for driving FET switching driver 102. The high side and low side are in a second voltage domain 2 and a third voltage domain 3, respectively.

Because the voltage swing amplitude is the same in interpolator 120 and the input stage of comparator 122, the same input voltage is converted to different output voltages in different voltage domains with the same propagation delay.

Figure 2:
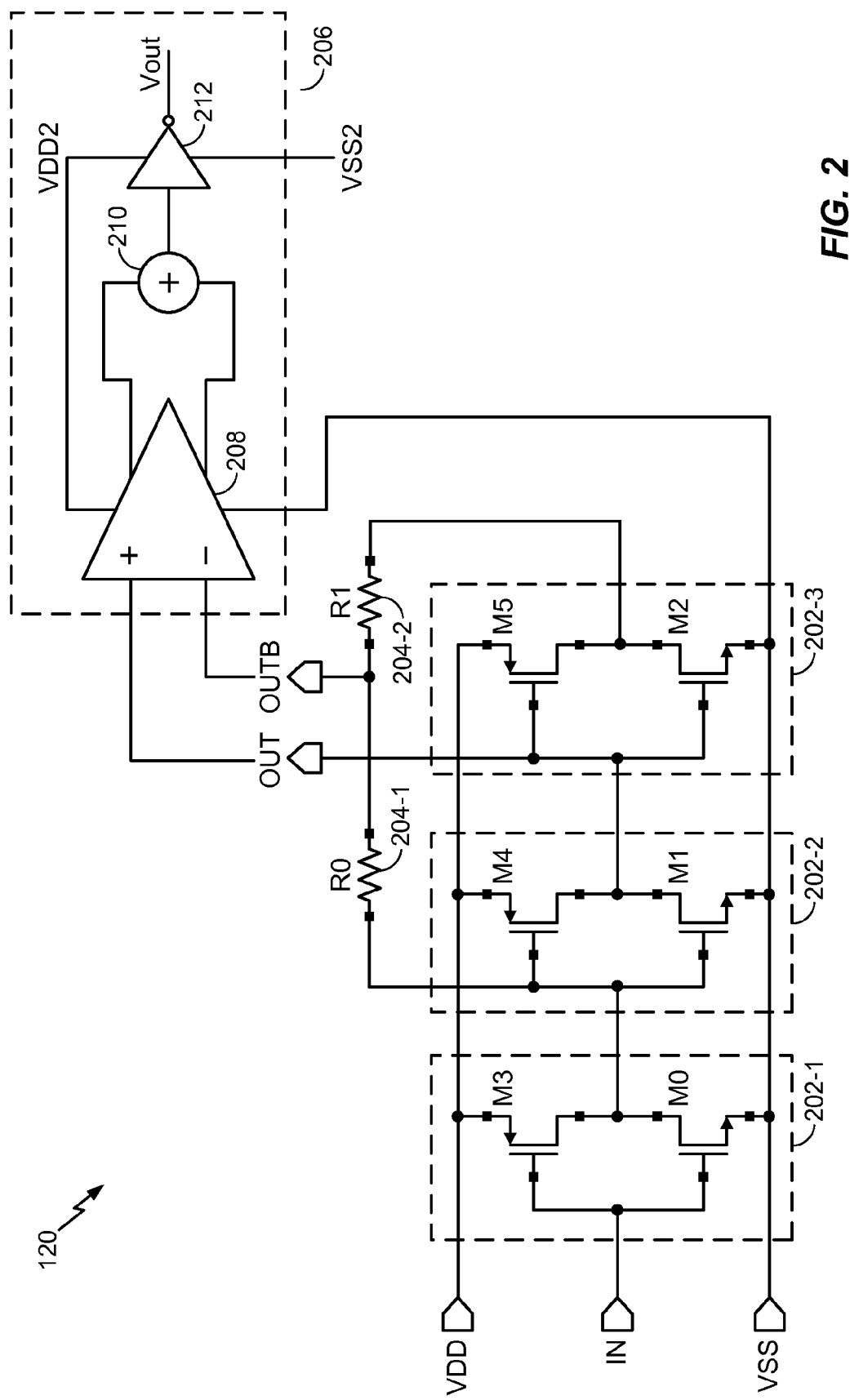
FIG. 2 illustrates a block diagram of an interpolator according to an embodiment.

FIG. 2 illustrates a block diagram of interpolator 120 according to an embodiment. Interpolator 120 comprises a plurality of inverters 202-1 (formed of PMOS transistor M3 and NMOS transistor M0), 202-2 (formed of PMOS transistor M4 and NMOS transistor M1) and 202-3 (formed of PMOS transistor M5 and NMOS transistor M2), a plurality of resistors 204-1 and 204-2, and a comparator 206. Comparator 206 comprises a comparator 208, a summing circuit 210, and an inverter 212.

Figure 3:
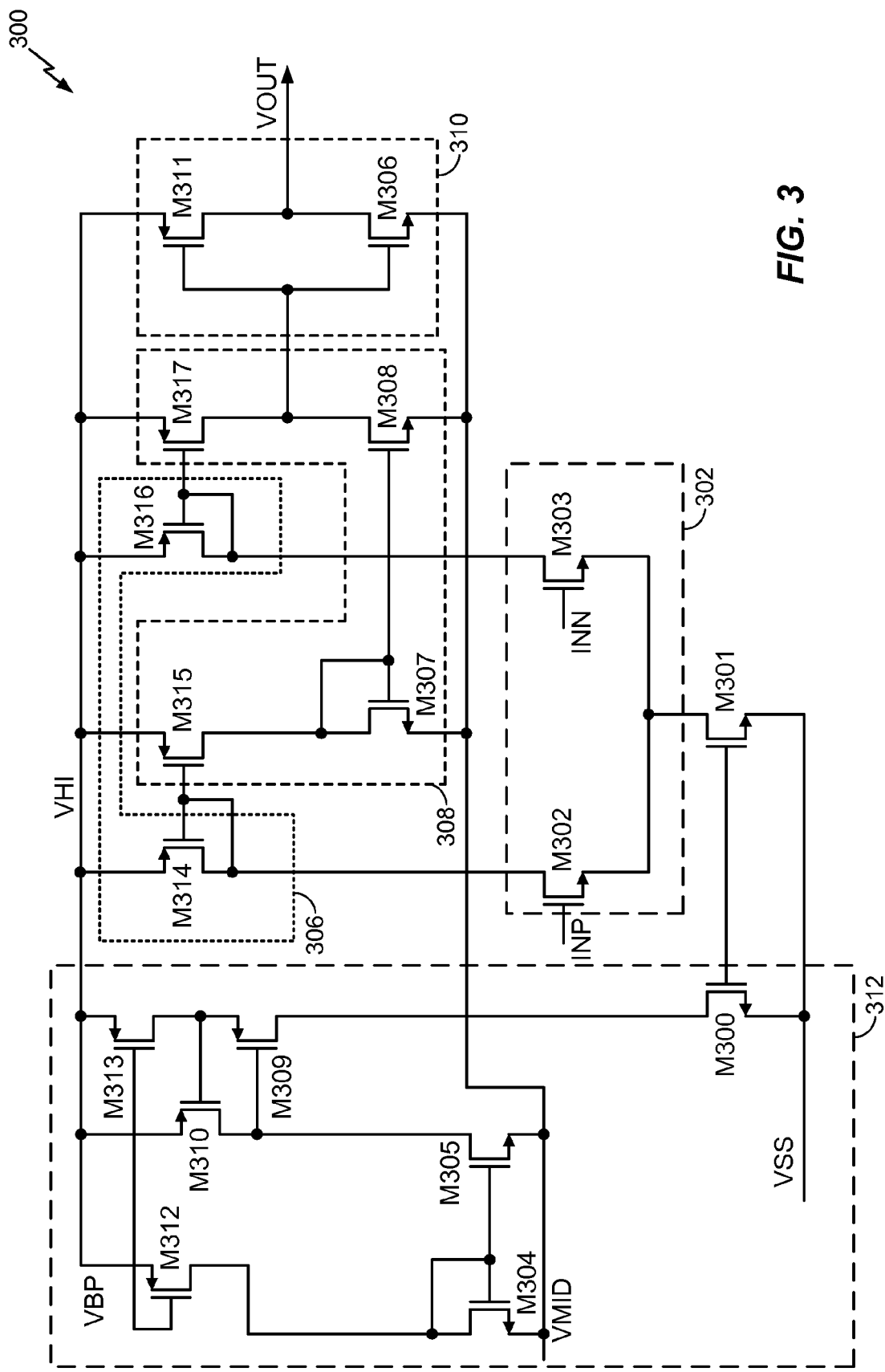
FIG. 3 illustrates a block diagram of a comparator according to an embodiment.
Figure 4:
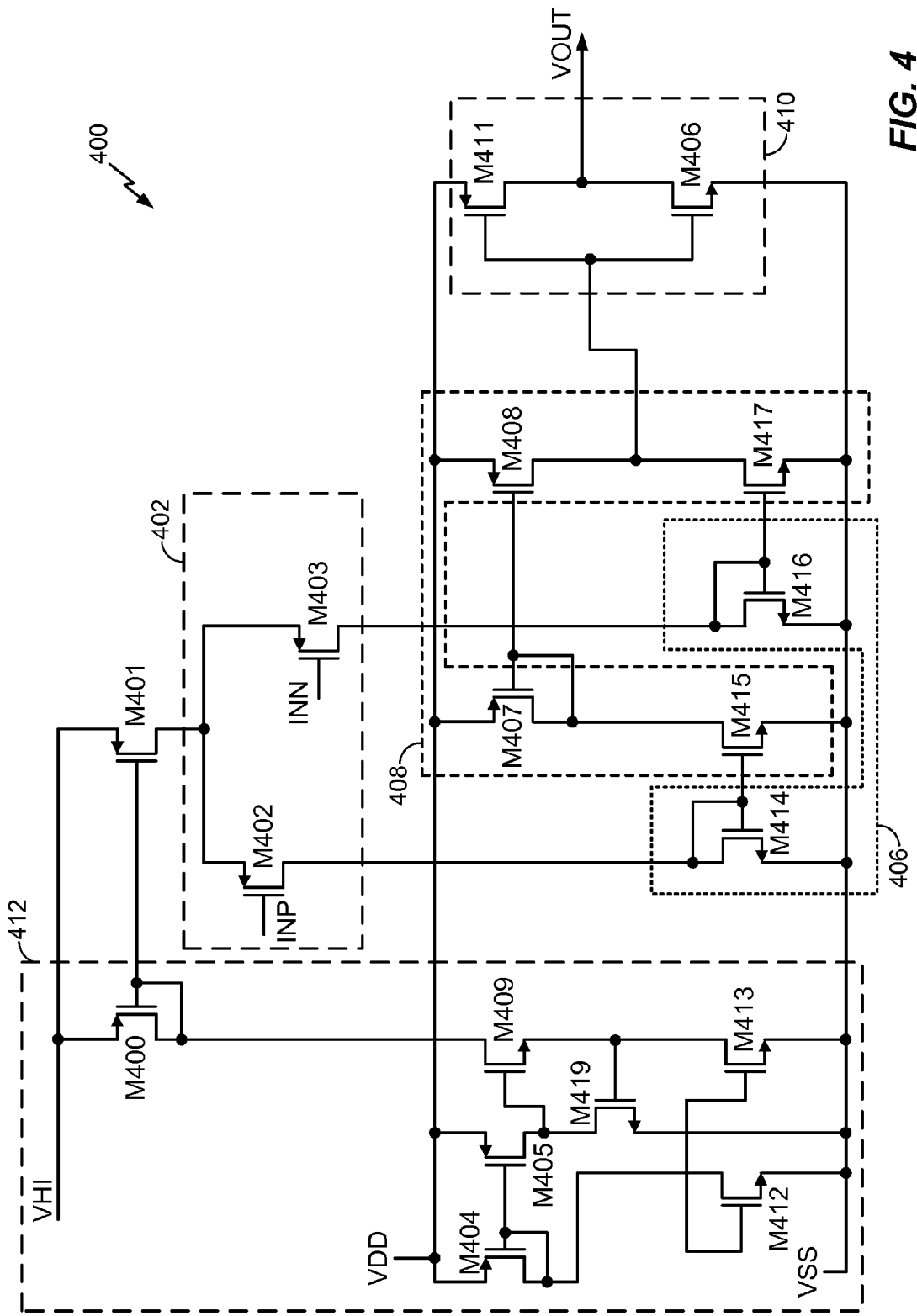
FIG. 4 illustrates a block diagram of a comparator according to another embodiment.

Interpolator 120 comprises an inverter chain of three inverters 202-1, 202-2 and 202-3 with a first output OUT generated by second inverter 202-2 and an inverted output OUTB generated by a common node between two series connected resistors 204-1 and 204-2 between the outputs of first inverter 202-1 and third invertor 202-3. The two series resistors 204-1 and 204-2 average the outputs of first inverter 202-1 and third inverter 202-3 so that the output OUTB is inverted (e.g., 180 degrees out of phase) from the output OUT, and switches at substantially the same time. The two series resistors 204-1 and 204-2 provide feedback from inverter 202-3 and feed forward from inverter 202-1. The two series resistors 204-1 and 204-2 divide the outputs of the inverters 202-1 and 202-3 to average the outputs. The output OUT and the output OUTB are provided as differential inputs to comparator 206. The single-ended input signal IN to the inverters 201 is converted to the symmetric differential output signals OUT and OUTB within the same voltage domain (in this example, VDD/VSS). Examples of comparator 206 are illustrated in FIGS. 3 and 4. In some embodiments, resistors 204-1 and 204-2 have the same resistance.

Comparator 208 compares the output signals OUT and OUTB and provides currents indicative of the comparison to summing circuit 210 adds the pair of currents from comparator 208 and generates a voltage signal indicative of the added pair of currents to inverter 212. The input stage of the comparator 208 and inverters 202 operate in the first voltage domain (in this example VDD/VSS). The rest of comparator 208 and the summing circuit 210 operates in a second different voltage domain (in this example, voltages VDD2/VSS2). Inverter 212 inverts the voltage signal generated by summing circuit 210 to generate the single-ended output Vout in the second different voltage domain (in this example, voltages VDD2/VSS2).

FIG. 3 illustrates a block diagram of a voltage level shifter 300 according to an embodiment. Voltage level shifter 300 converts the differential inputs (INP/INM) that are in a first voltage domain (in this example, voltages VDD/VSS, not shown in FIG. 3) into a single-ended output (VOUT) in a different second voltage domain (in this example, voltages VHI/VMID) for driving switching driver 102, for example. Voltage level shifter 300 comprises a differential input pair 302, a load circuit 306, a summing circuit 308, an output inverter 310, a regulated current source 312, and a tail current source M301. Load circuit 306 comprises PMOS transistors M314 and M316 for actively loading differential input pair 302. Comparator 300 comprises a differential input pair 302 formed of NMOS transistors M302 and M303 that generate currents (e.g., by using current mirrors) based on the outputs from interpolator 120.

In the description of FIG. 3, the outputs from interpolator 120 are described as differential inputs INP and INM. The differential input pair 302 generates currents (e.g., by using current mirrors), which are provided to summing circuit 308.

Summing circuit 308 comprises PMOS transistors M315 and M317 and NMOS transistors M307 and M308. Transistor M315 forms a current mirror with transistor M314 to mirror the current of transistor M314 in transistor M315. Transistor M308 forms a current mirror with transistor M307. The two current mirrors mirror the current of input transistor M302 in transistor M308. Transistor M317 forms a current mirror with transistor M316 to mirror the current of transistor M316 in transistor M317. Transistor M317 mirrors the current of input transistor M303. The currents in transistors M317 and M308 reflect the sum of the currents in transistor M302 and transistor M303. Summing circuit 308 sums the currents from the differential input pair 302 and applies the summed current as reflected on the drain of transistor M317 to output inverter 310 formed of a PMOS transistor M311 and an NMOS transistor M306. Output inverter 310 generates a single ended output voltage. The output of summing circuit 308 is provided to output inverter 310 that generates a single ended output voltage (VOUT). Output inverter 310 operates with the different voltage domain (in this example, voltage rails VHI/VMID), which are different from the voltage rails VDD/VSS of interpolator 120 as shown in FIG. 2.

Voltage level shifter 300 further comprises a regulated current source 312 that regulates the bias of tail current transistor M301. Regulated current source 312 regulates the tail current of tail current transistor M301 to be supply insensitive so that the propagation delay also will be independent of the supply noise. Regulated current source 312 comprises PMOS transistors M309, M310, M312 and M313 and NMOS transistors M300, M304 and M305.

Transistor M313 supplies current for regulator current source 312. Transistor M309 is a cascode transistor that boosts the output impedance of transistor M313. Transistor M310 provides feedback of the impedance of transistor M313. Transistor M304, transistor M305, and transistor M312 bias transistor M310. Transistor M300 mirrors the current from transistor M313 in the tail current source M301 to regulate the supply noise.

FIG. 4 illustrates a block diagram of a voltage level shifter 400 according to another embodiment. Voltage level shifter 400 includes a comparator analogous to voltage level shifter 200 that is flipped from VDD to VSS. Voltage level shifter 400 converts the differential inputs (INP/INM) that are in a first voltage domain (in this example, voltages VHI/VMID, not shown in FIG. 4) into a single-ended output (VOUT) in a different second voltage domain (in this example, voltages VDD/VSS, not shown in FIG. 4) for driving switching driver 102, for example. Voltage level shifter 400 comprises a differential input pair 402, a load circuit 406, a summing circuit 408, an output inverter 410, a regulated current source 412, and a tail current source M401. Load circuit 406 comprises PMOS transistors M414 and M416 for actively loading differential input pair 402. Voltage level shifter 400 comprises a differential input pair 402 formed of NMOS transistors M402 and M403 that generate currents (e.g., by using current mirrors) based on the outputs from interpolator 120.

In the description of FIG. 4, the outputs from interpolator 120 are described as differential inputs INP and INM. The differential input pair 402 generates currents (e.g., by using current mirrors), which are provided to summing circuit 408. Summing circuit 408 comprises NMOS transistors M415 and M417 and PMOS transistors M407 and M408. Transistor M415 forms a current mirror with transistor M414 to mirror the current of transistor M414 in transistor M415. Transistor M408 forms a current mirror with transistor M407. The two current mirrors mirror the current of input transistor M402 in transistor M408. Transistor M417 forms a current mirror with transistor M416 to mirror the current of transistor M416 in transistor M417. Transistor M417 mirrors the current of input transistor M404. The currents in transistors M417 and M408 reflect the sum of the currents in transistor M402 and transistor M404. Summing circuit 408 sums the currents from the differential input pair 402 and applies the summed current as reflected on the drain of transistor M417 to output inverter 410 formed of a PMOS transistor M411 and an NMOS transistor M406. Output inverter 410 generates a single ended output voltage. The output of summing circuit 408 is provided to output inverter 240 that generates a single ended output voltage (VOUT). Output inverter 410 operates with the different voltage domain (in this example, voltage rails VDD/VSS).

Voltage level shifter 400 further comprises a regulated current source 412 that regulates the bias of tail current transistor M401. Regulated current source 412 regulates the tail current of tail current transistor M401 to be supply insensitive so that the propagation delay also will be independent of the supply noise. Regulated current source 410 comprises NMOS transistors M409, M410, M412 and M414 and PMOS transistors M400, M404 and M405.

Transistor M414 supplies current for regulator current source 410. Transistor M409 is a cascode transistor that boosts the output impedance of transistor M414. Transistor M410 provides feedback of the impedance of transistor M414. Transistor M404, transistor M405, and transistor M412 bias transistor M410. Transistor M400 mirrors the current from transistor M414 in the tail current source M401 to regulate the supply noise.

Figure 5:
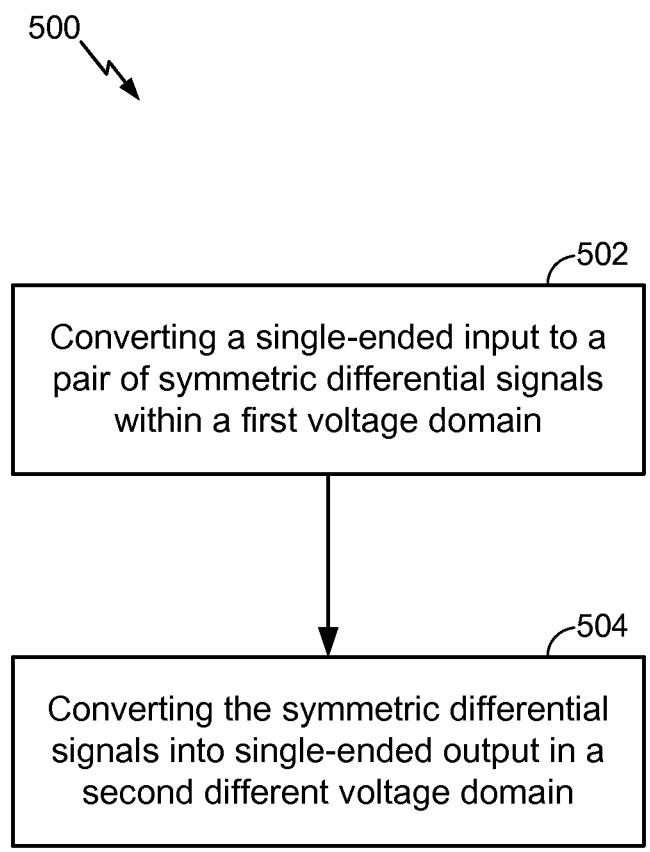
FIG. 5 illustrates a simplified diagram illustrating a process flow for transition control of a voltage level shifter according to an embodiment.

FIG. 5 illustrates a simplified diagram illustrating a process flow 500 for transition control of a voltage level shifter according to an embodiment.

At 502, a single-ended input is converted to a pair of symmetric differential signals within a first voltage domain. At 504, the symmetric differential signals is converted into a single-ended output in a second different voltage domain.

Figure 6:
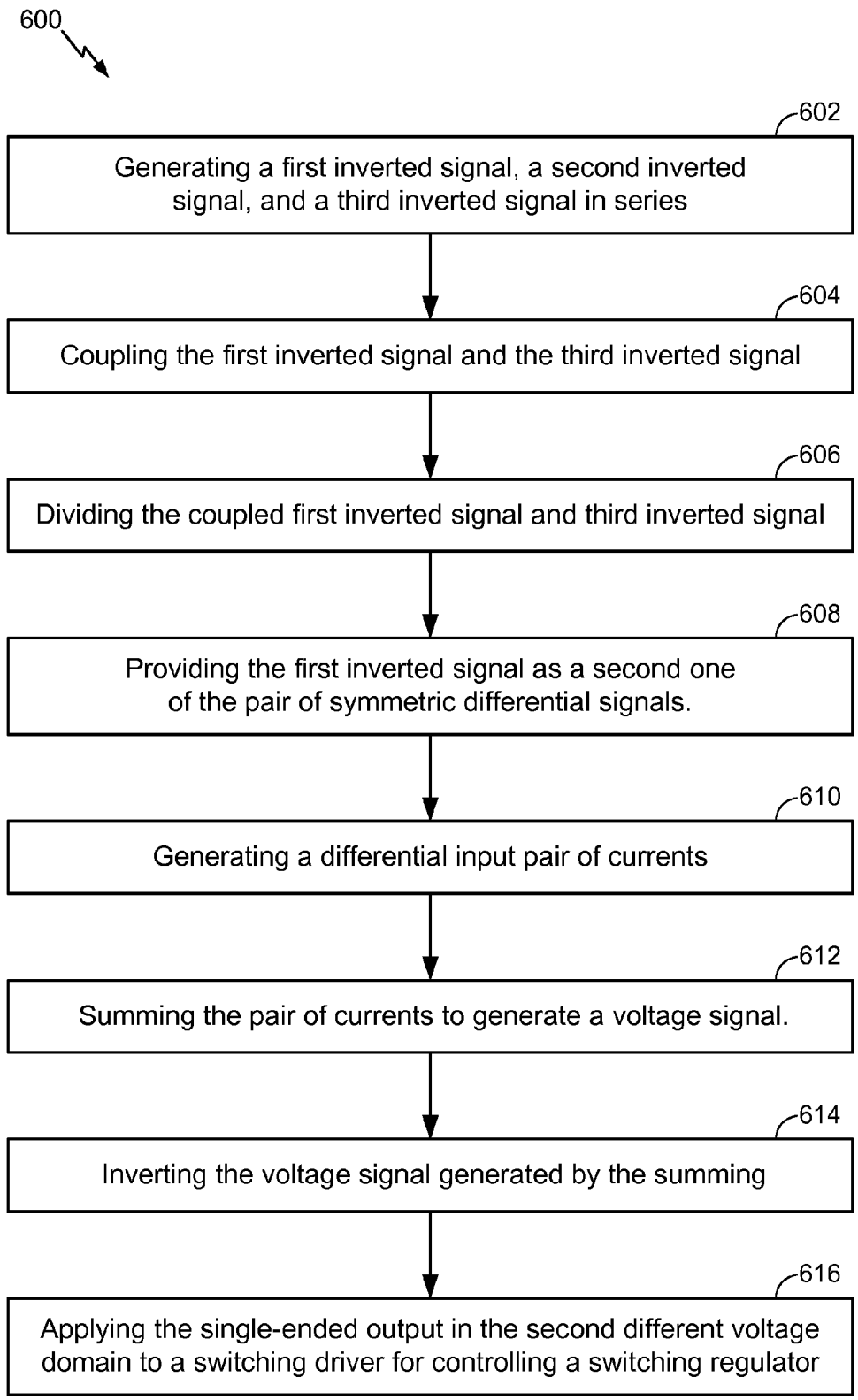
FIG. 6 illustrates a simplified diagram illustrating a process flow for transition control of a voltage level shifter according to another embodiment.

FIG. 6 illustrates a simplified diagram illustrating a process flow 600 for transition control of a voltage level shifter according to an embodiment.

Although process flow 600 is described for voltage level shifter 300, the process flow may be applied for other voltage level shifters.

During a process of converting a single-ended input to a pair of symmetric differential signals within a first voltage domain, at 602, a first inverted signal, a second inverted signal, and a third inverted signal are generated in series from a single ended input signal. At 604, the first inverted signal and the third inverted signal are coupled. At 606, the coupled first inverted signal and third inverted signal are divided to provide a first one of the pair of symmetric differential signals. At 608, the first inverted signal is provided as a second one of the pair of symmetric differential signals.

During a process of converting the symmetric differential signals into single-ended output in a second different voltage domain, at 610, a differential input pair of currents is generated in response to the pair of symmetric differential signals within a first voltage domain. At 612, the pair of currents is summed to generate a voltage signal. At 614, the voltage signal generated by the summing circuit is inverted to generate the single-ended output in the second different voltage domain.

At 616, the single-ended output in the second different voltage domain is applied to a switching driver for controlling a switching regulator.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A level shifter comprising:
   a phase interpolator configured to convert a single-ended input to a pair of symmetric differential signals within a first voltage domain; and
   a comparator configured to convert the symmetric differential signals into a single-ended output in a second different voltage domain,
   wherein the single ended output of the comparator is configured to be coupled to drive a switching driver of a switching regulator.

2. The level shifter of claim 1 wherein the phase interpolator comprises a first inverter, a second inverter and a third inverter connected in series, and further comprises a first resistor and a second resistor connected in series, the second inverter providing a first output signal,
   wherein the first resistor comprises an input terminal and an output terminal and the second resistor comprises an input terminal and an output terminal,
   wherein output of the first inverter is connected to the input terminal of the first resistor and output of the third inverter is connected to the input terminal of the second resistor, and
   wherein the output terminals of the first and second resistors are connected together at a node between the first resistor and the second resistor providing a second output signal, the first and second output signals being inverted and symmetric.

3. The level shifter of claim 1 wherein the phase interpolator comprises a first inverter, a second inverter and a third inverter connected in series, and further comprises a voltage divider coupled between outputs of the first inverter and the third inverter, the voltage divider providing a first one of the pair of symmetric differential signals, the second inverter providing a second one of the pair of symmetric differential signals.

4. The level shifter of claim 1 wherein the phase interpolator drives the comparator, the comparator includes:
   a differential input pair configured to generate a pair of currents in response to outputs of the phase interpolator, and
   a summing circuit configured to add the pair of currents from the comparator and to generate a voltage signal indicative of the added pair of currents to an inverter operating in the second different voltage domain.

5. The level shifter of claim 4 wherein the inverter is configured to invert the voltage signal generated by the summing circuit to generate the single-ended output in the second different voltage domain.

6. A method for shifting a voltage level, the method comprising:
converting a single-ended input to a pair of symmetric differential signals within a first voltage domain using a phase interpolator;
converting the symmetric differential signals into a single-ended output in a second different voltage domain; and
applying the single-ended output in the second different voltage domain to a switching driver for controlling a switching regulator.

7. The method of claim 6 wherein converting the single-ended input to the pair of symmetric differential signals within the first voltage domain comprises:
inverting the single-ended input to generate a first inverted signal;
generating a second inverted signal as a first one of the symmetric differential signals in response to an inversion of the first inverted signal;
generating a third inverted signal in response to an inversion of the second inverted signal;
generating a feedback signal from the third inverted signal; and
generating a second one of the symmetric differential signal from the feedback signal.

8. The method of claim 7 wherein generating the second one of the symmetric differential signal from the feedback signal comprises:
dividing the first inverted signal and the third inverted signal.

9. The method of claim 6 wherein converting the single-ended input to the pair of symmetric differential signals within the first voltage domain comprises:
generating a first inverted signal, a second inverted signal, and a third inverted signal in series from the single-ended input signal;
coupling the first inverted signal and the third inverted signal; and
dividing the coupled first inverted signal and the third inverted signal to provide a first one of the pair of symmetric differential signals, the second inverted signal providing a second one of the pair of symmetric differential signals.

10. The method of claim 6 wherein converting the symmetric differential signals into the single-ended output in the second different voltage domain comprises:
generating a differential input pair of currents in response to the pair of symmetric differential signals within the first voltage domain, and
summing the pair of currents to generate the single-ended output indicative of the summed pair of currents.

11. The method of claim 6 wherein converting the symmetric differential signals into the single-ended output in the second different voltage domain comprises:
generating a differential input pair of currents in response to the pair of symmetric differential signals within the first voltage domain, summing the pair of currents to generate a voltage signal; and
inverting the voltage signal to generate the single-ended output in the second different voltage domain.

12. A level shifter circuit comprising:
means for converting a single-ended input to a pair of symmetric differential signals within a first voltage domain; and
means for converting the symmetric differential signals into a single-ended output in a second different voltage domain,
wherein the single-ended output in the second different voltage domain is applied to a switching driver for controlling a switching regulator.

13. The level shifter circuit of claim 12 wherein the means for converting the single-ended input to the pair of symmetric differential signals within the first voltage domain comprises:
means for inverting the single-ended input to generate a first inverted signal;
means for generating a second inverted signal as a first one of the symmetric differential signals in response to an inversion of the first inverted signal;
means for generating a third inverted signal in response to an inversion of the second inverted signal; and
means for generating a second one of the symmetric differential signal from the the first inverted signal and the third inverted signal.

14. The level shifter circuit of claim 12 wherein the means for converting the single-ended input to the pair of symmetric differential signals within the first voltage domain comprises:
means for generating a first inverted signal, a second inverted signal, and a third inverted signal in series from the single-ended input signal;
means for coupling the first inverted signal and the third inverted signal; and
means for dividing the coupled first inverted signal and the third inverted signal to provide a first one of the pair of symmetric differential signals, the second inverted signal providing a second one of the pair of symmetric differential signals.

15. The level shifter circuit of claim 12 wherein the means for converting the symmetric differential signals into the single-ended output in the second different voltage domain comprises:
means for generating a differential input pair of currents in response to the pair of symmetric differential signals within the first voltage domain; and
means for summing the pair of currents to generate the single-ended output indicative of the summed pair of currents.

16. The level shifter circuit of claim 12 wherein the means for converting the symmetric differential signals into the single-ended output in the second different voltage domain comprises:
means for generating a differential input pair of currents in response to the pair of symmetric differential signals within the first voltage domain, means for summing the pair of currents to generate a voltage signal; and
means for inverting the voltage signal to generate the single-ended output in the second different voltage domain.

* * * * *